United States Patent
Hosek (10) Patent No.: US 10,269,606 B2
(45) Date of Patent: Apr. 23, 2019

(54) TWO-LINK ARM TRAJECTORY

(71) Applicant: Persimmon Technologies, Corp., Wakefield, MA (US)

(72) Inventor: Martin Hosek, Lowell, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 173 days.

(21) Appl. No.: 14/703,216

(22) Filed: May 4, 2015

(65) Prior Publication Data

US 2015/0314459 A1  Nov. 5, 2015

Related U.S. Application Data (60) Provisional application No. 61/988,589, filed on May 5, 2014.

(51) Int. Cl.

| | |
|---|---|
| *H01L 21/677* | (2006.01) |
| *B25J 18/00* | (2006.01) |
| *B25J 11/00* | (2006.01) |
| *B25J 9/16* | (2006.01) |
| *H01L 21/687* | (2006.01) |
| *B25J 9/04* | (2006.01) |

(52) U.S. Cl.
CPC ........ *H01L 21/67766* (2013.01); *B25J 9/042* (2013.01); *B25J 9/1679* (2013.01); *B25J 11/0095* (2013.01); *B25J 18/00* (2013.01); *H01L 21/67706* (2013.01); *H01L 21/67742* (2013.01); *H01L 21/68707* (2013.01)

(58) Field of Classification Search
CPC ..... B25J 9/04; B25J 9/041; B25J 9/042; B25J 9/1638; B25J 9/1641; B25J 9/1648; B25J 9/1664; H01L 21/67703; H01L 21/67715; H01L 21/67739; H01L 21/67742; H01L 21/67745; H01L 21/67748
USPC ..... 414/222.01, 226.05, 744.2, 744.3, 744.4, 414/744.5, 935; 901/9, 15, 20, 23
See application file for complete search history.

(56) References Cited

U.S. PATENT DOCUMENTS

| | | | | |
|---|---|---|---|---|
| 6,121,743 A | * | 9/2000 | Genov | ..................... B25J 9/042 318/568.11 |
| 8,716,909 B2 | | 5/2014 | Hosek et al. | ................... 310/64 |

(Continued)

FOREIGN PATENT DOCUMENTS

JP  2014170828 A  *  9/2014  ............ B25J 9/1664

*Primary Examiner* — Ronald P Jarrett
*Assistant Examiner* — Brendan P Tighe
(74) *Attorney, Agent, or Firm* — Harrington & Smith (57) ABSTRACT

Providing a first movement including rotating a first arm about a rotational axis of a robot drive; rotating a second arm on the first arm, where the first and second arms form a robot arm, where the first and second arms are the only arms of the robot arm, where the robot arm has an end effector rotationally fixed to the second arm, and where the end effector is configured to support a substrate thereon for transporting the substrate by the robot arm; and controlling the rotating to provide a path of the end effector such that the end effector does not contact the substrate during the rotating. Providing a second movement including rotating the arms to provide an at least partially straight linear path of a center of the substrate relative to the rotational axis of the drive robot when the substrate is on the end effector.

7 Claims, 9 Drawing Sheets

(56) References Cited

U.S. PATENT DOCUMENTS

| | | | |
|---|---|---|---|
| 2005/0079042 A1* | 4/2005 | Maeda | B25J 9/042 414/744.2 |
| 2006/0099063 A1* | 5/2006 | Pietrantonio | B25J 9/042 414/744.5 |
| 2006/0182535 A1* | 8/2006 | Rice | H01L 21/67173 414/217 |
| 2007/0020082 A1* | 1/2007 | Caveney | B25J 9/042 414/744.5 |
| 2009/0259335 A1* | 10/2009 | Ikeda | H01L 21/67184 700/228 |
| 2010/0135752 A1* | 6/2010 | Imai | B25J 9/1664 414/217 |
| 2010/0243168 A1* | 9/2010 | Nakano | H01L 21/67742 156/345.54 |
| 2013/0085606 A1* | 4/2013 | Tagashira | B25J 9/1664 700/262 |
| 2014/0249674 A1* | 9/2014 | Kodama | B25J 9/1664 700/246 |
| 2014/0249675 A1* | 9/2014 | Krishnasamy | H01L 21/67259 700/250 |

* cited by examiner

TWO-LINK ARM TRAJECTORY

CROSS REFERENCE TO RELATED APPLICATION

This application claims priority under 35 USC 119(e) on provisional application No. 61/988,589 filed May 5, 2014 which is hereby incorporated by reference in its entirety.

BACKGROUND

Technical Field

The exemplary and non-limiting embodiments relate generally to a robot arm and, more particularly, to control of a robot arm.

Brief Description of Prior Developments

Use of a robot scara arm to transport substrates is known. Conventionally, a robot scara arm for a substrate transport has rotational joints with at least three axis of rotation provided including a rotational wrist at a joint of an end effector to a link of the arm.

SUMMARY

The following summary is merely intended to be exemplary. The summary is not intended to limit the scope of the claims.

In accordance with one aspect, an example method comprises providing a first movement comprising rotating a first arm about a rotational axis of a robot drive; rotating a second arm on the first arm, where the first and second arms form a robot arm, where the first and second arms comprise the only arms of the robot arm, where the robot arm comprises an end effector rotationally fixed to the second arm, and where the end effector is configured to support a substrate thereon for transporting the substrate by the robot arm; and controlling the rotating of the first and second arms to provide a path of the end effector such that, before a pickup of the substrate by the robot arm or after placing of the substrate by the robot arm, the end effector does not contact the substrate during the rotating; and providing a second movement comprising the arms of the robot arm rotating to provide an at least partially straight linear path of a center of the substrate relative to the rotational axis of the drive robot when the substrate is on the end effector.

In accordance with another example, an example embodiment is provided in an apparatus comprising a robot drive; a robot arm comprising a first arm connected on a rotational axis of the robot drive, a second arm on the first arm, and an end effector rotationally fixed to the second arm, where the first and second arms comprise the only arms of the robot arm, and where the end effector is configured to support a substrate thereon for transporting the substrate by the robot arm; a controller connected to the robot drive, where the controller comprises at least one processor and at least one non-transitory memory including computer program code, the at least one memory and the computer program code configured to, with the at least one processor, cause the apparatus to: control the rotating of the first and second arms to provide a first movement with a path of the end effector such that, before a pickup of the substrate by the robot arm or after placing of the substrate by the robot arm, the end effector does not contact the substrate during the rotating; and control the rotating of the first and second arms to provide a second movement with an at least partially straight linear path of a center of the substrate relative to the rotational axis of the drive robot when the substrate is on the end effector.

In accordance with another example, an example embodiment is provided in a non-transitory program storage device readable by a machine, tangibly embodying a program of instructions executable by the machine for performing operations comprising: provide a first movement comprising: rotating a first arm about a rotational axis of a robot drive; rotating a second arm on the first arm, where the first and second arms form a robot arm, where the first and second arms comprise the only arms of the robot arm, where the robot arm comprises an end effector rotationally fixed to the second arm, and where the end effector is configured to support a substrate thereon for transporting the substrate by the robot arm; and controlling the rotating of the first and second arms to provide a path of the end effector such that, before a pickup of the substrate by the robot arm or after placing of the substrate by the robot arm, the end effector does not contact the substrate during the rotating; and provide a second movement comprising the arms of the robot arm rotating to provide an at least partially straight linear path of a center of the substrate relative to the rotational axis of the drive robot when the substrate is on the end effector.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
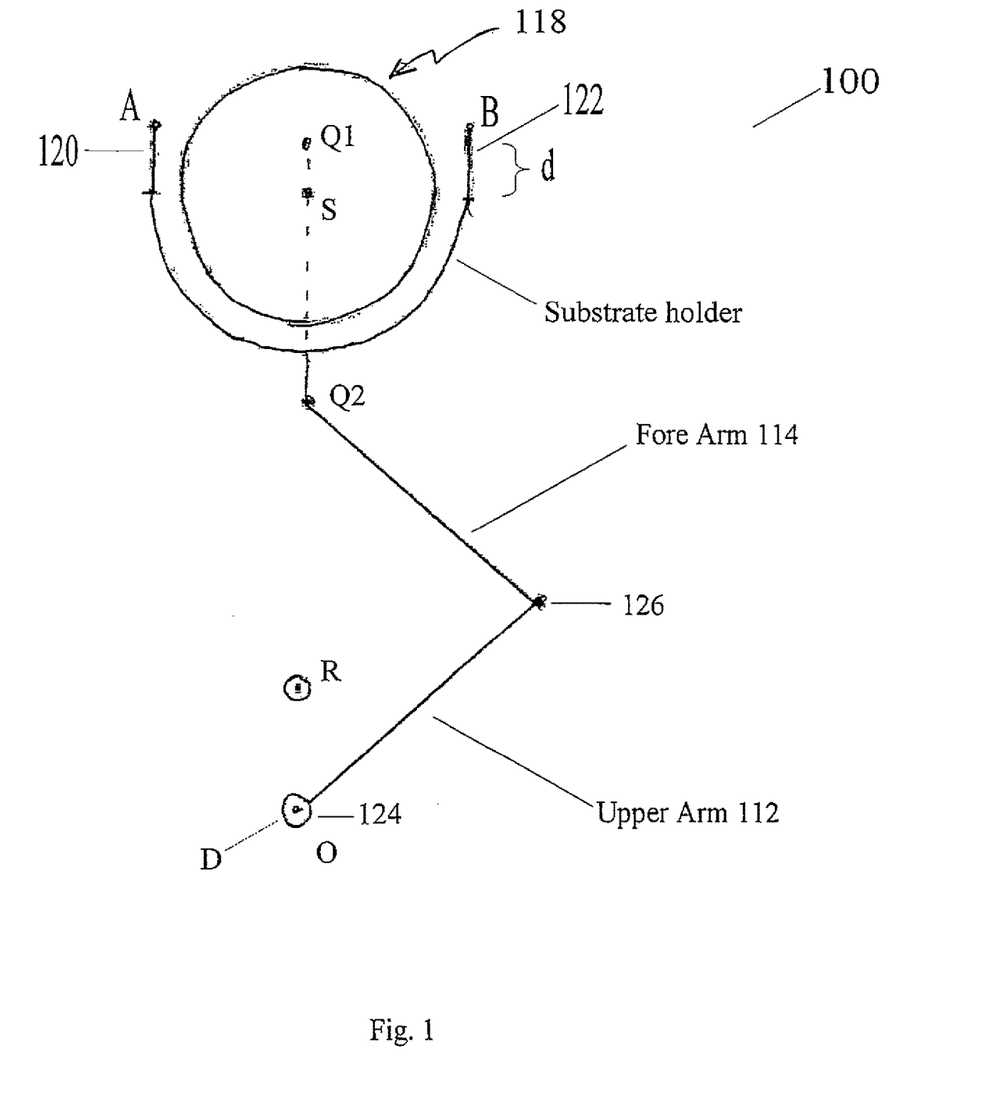
FIG. 1 is a schematic top view of a robot arm and a substrate.

FIG. 1 shows a schematic view of robot arm 100 which, in this example, is part of a substrate transport apparatus. Although the features will be described with reference to the example embodiments shown in the drawings, it should be understood that features can be embodied in many alternate forms of embodiments. In addition, any suitable size, shape or type of elements or materials could be used. The robot 100 in this example comprises an upper arm link 112, a forearm link 114 and an end effector or substrate holder 116. The robot 100 may be suitable for atmospheric, vacuum or other environment for example. Further, in an alternate example the robot 100 may have more than two links and more than one end effector. Substrate holder 116 may have a supporting structure to support substrate 118. Here, the supporting structure may include tines 120, 122 that extend beyond the center S of substrate 118. In the disclosed embodiment, holder 116 is fixed with respect to forearm 114. In other words, the end effector 116 is rotationally stationary on the end of the forearm 114 and cannot rotate relative to the forearm 114. Thus, the robot drive D may be a two rotary axis drive where one axis rotatably drives upper arm 112 via shoulder joint 124 and where another axis rotatably drives forearm 114 (and holder 116) via elbow joint 126 and pulleys (not shown) back to drive D. The example embodiment is described below with a trajectory such that the robot is driven to effectively clear substrate 118 during retraction and/or extension, for example where the holder or end effector 116 effectively clears (does not contact) the substrate 118.

Figure 8:
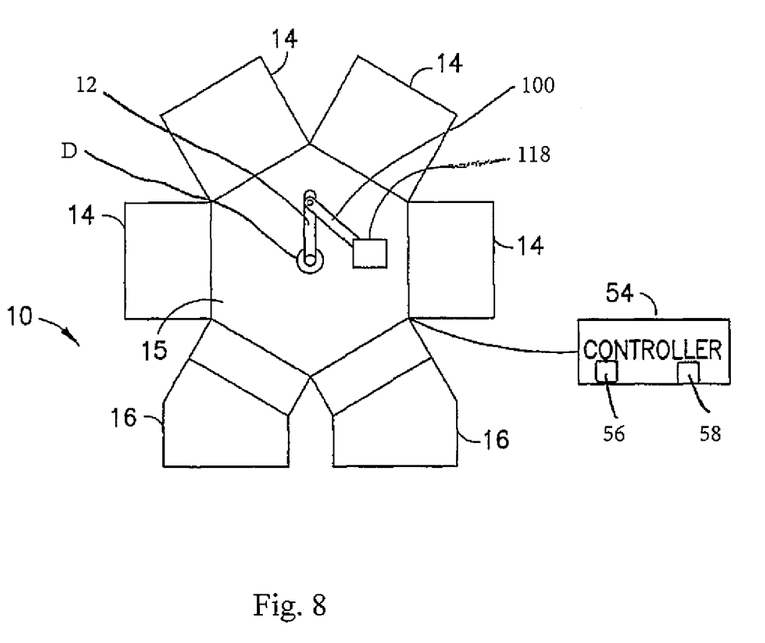
FIG. 8 is a schematic view of a substrate processing apparatus having the robot arm.

Referring also to FIG. 8, there is shown a schematic top plan view of an example substrate processing apparatus 10 having the substrate transport apparatus 12 with comprises the robot arm 100 and the robot drive D. In addition to the substrate transport apparatus 12, the substrate processing apparatus 10 includes multiple substrate processing chambers 14 and substrate cassette elevators 16 connected to a vacuum chamber 15. The transport apparatus 12 is located, at least partially, in the chamber 15 and is adapted to transport planar substrates, such as semiconductor wafers or flat panel displays for example, between and/or among the chambers 14 and elevators 16. In alternate embodiments, the transport apparatus 12 could be used in any suitable type of substrate processing apparatus. The drive D is connected to a controller 54. The controller 54 comprises at least one processor 56 and at least one memory 58. Sensors of the drive D are connected to the controller to provide feedback, and the controller is connector to stators of the drive D to rotate drive shafts. Drive D may have features as disclosed in U.S. Pat. No. 8,716,909 dated May 6, 2014 entitled "Robot with Heat Dissipating Stator" which is hereby incorporated by reference in its entirety.

Figure 2:
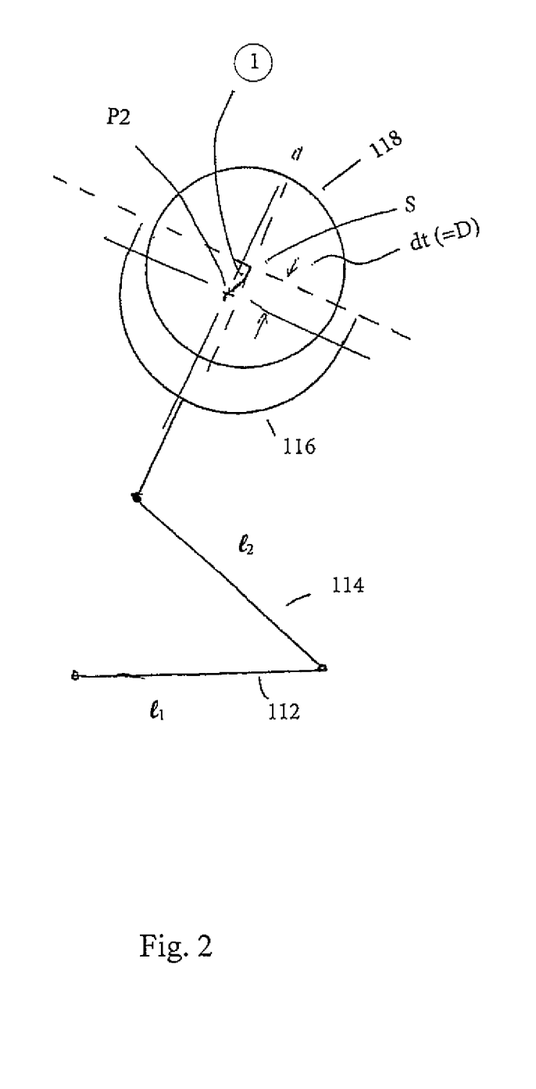
FIG. 2 is a schematic top view as in FIG. 1 with the robot arm moved relative to the substrate along a first section of a first path.

The following abbreviations/symbols that may be found in the specification and/or the drawing figures are defined as follows:
 S: Station center and substrate center when in the station
 D: tangential extension of end-effector tines beyond substrate center (may be pointing parallel to line OS or at any suitable angle or otherwise)
 A, B: End effector tine tips
 R: retract position
 O: Robot center
 Q1: point fixed to the end-effector at the mid-point of line AB (assuming both same length)
 Q2: imaginary point on fore-arm such that line defined by Q1-Q2 is perpendicular to line AB (not necessarily a wrist as there is no wrist)
 QC: Point fixed to end-effector that coincides with station center S when the arm is extended to the station (aligns with S upon full extension)
 P1: end point of section 2 of trajectory and start point of section 3 of trajectory
 P2: end point of section 1 of trajectory and start point of section 2 of trajectory
Trajectory Segments FIG. 1 shows the robot arm 100 in a position where it is extended to the station center S, where substrate 118 is placed on or picked from nominally on center. For the example in FIG. 1, the trajectory of the end-effector 116 is composed of three segments. FIG. 2 shows segment 1 which is generated by retracting the arm so that the station center defined by S lies on the line defined by Q1-Q2 shown in FIG. 1. The end point of segment 1 corresponds to point 22 being a distance "D" (may be greater than the tine length to provide clearance) from the station center S. The curve of this segment corresponds to maintaining tangency of parallel lines with respect to the tines to be parallel with tangent lines of the edge of substrate S. In this manner, the tines maintain a common equal spaced relationship from their respective edge of the substrate S. FIG. 2 shows the trajectory going to the left; in alternate aspects the trajectory may go to the right as a function, for example, of the angle between the tines and the nominal radial OS line of the station during full extension as well as the link lengths and the station location (for example, FIG. 2 shows a larger angle).

Figure 3:
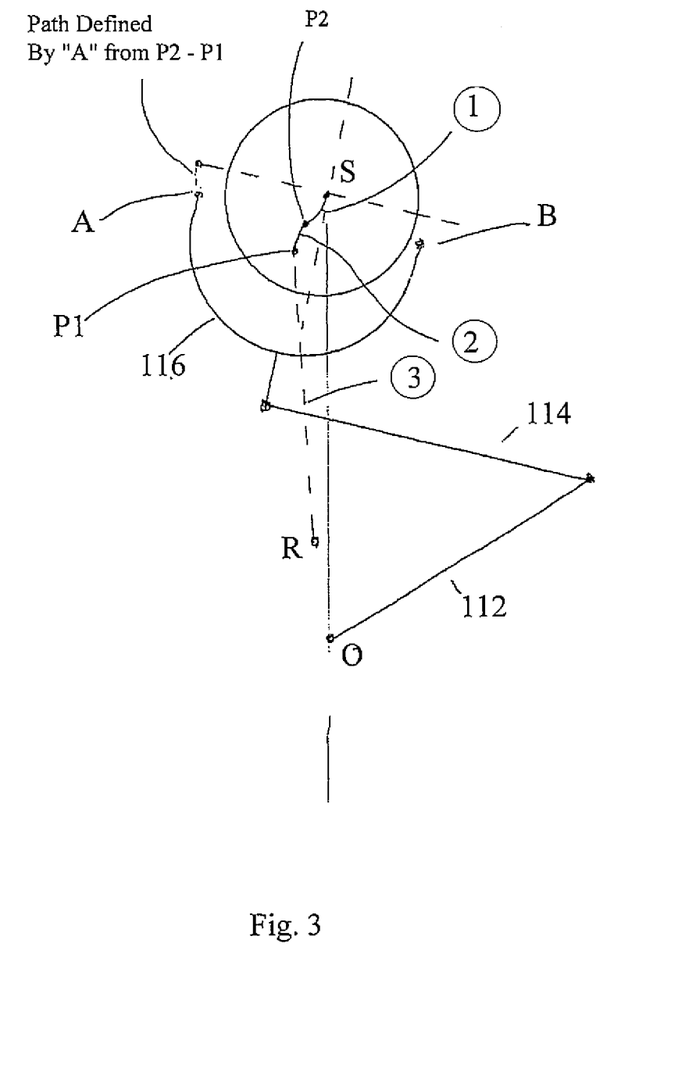
FIG. 3 is a schematic top view as in FIG. 2 with the robot arm moved relative to the substrate along a second section of the first path.

FIG. 3 shows the generation of segments 2 and 3. In segment 2, the tip A describes a circular path about the point S. The purpose of segment 2 is to blend between segments 1 and 3, for example, such that tine B does not interfere with the substrate edge upon further retraction, and such that the arm does not interfere with other components. The slope of tip A is continuous as the trajectory transitions from segment 1 to segment 2 and hence the slope of a point on the trajectory (or any other point on the link) is continuous as the trajectory transitions from segment 1 to segment 2. The end point of segment 2 (point P1) corresponds to the point a straight line passing through the origin or other location is tangential to the segment. Segment 3 is the straight line joining retract position R and point P1.

Trajectory Approximation as Blended Straight Line Segments

Figure 4:
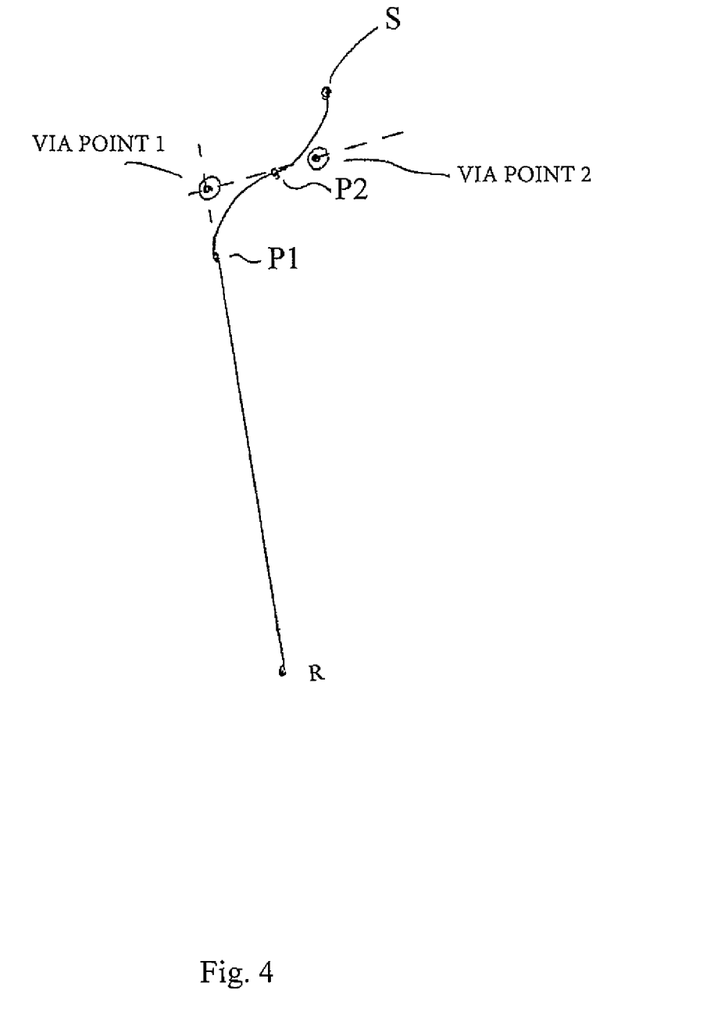
FIG. 4 is a diagram illustrating paths.
Figure 5:
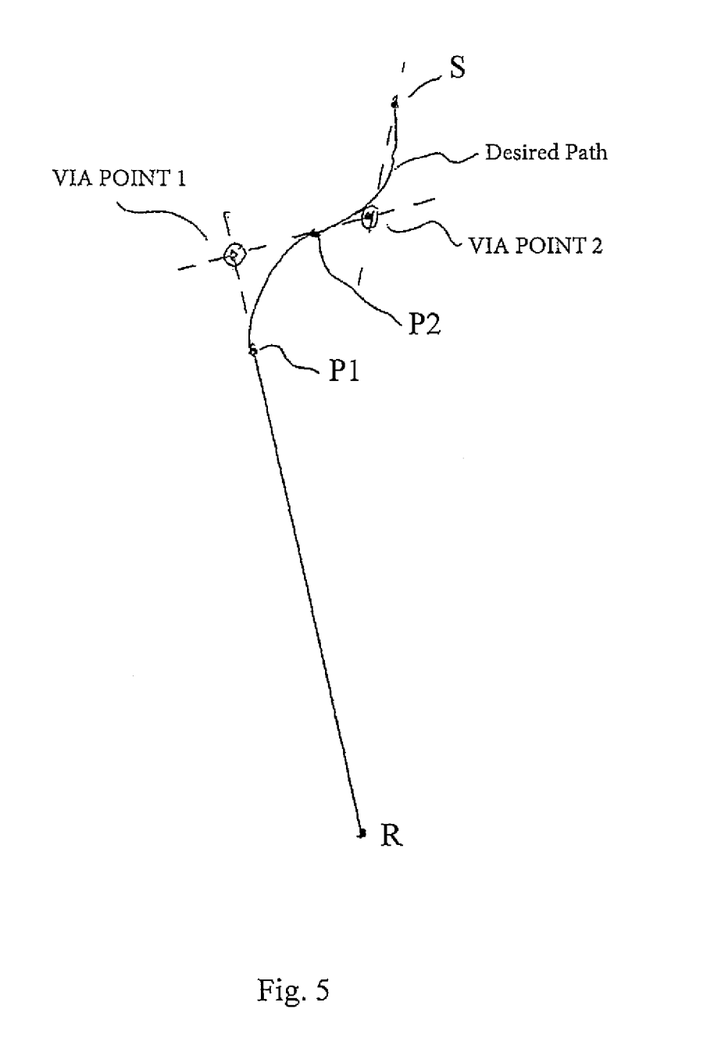
FIG. 5 is a diagram illustrating paths.

FIGS. 4 and 5 show an example definition of a trajectory comprised of three straight line segments which when blended will approximate the desired trajectory within an acceptable tolerance on the deviation from the actual path. The straight line segments may be used as a guide for designing the actual curved path segments S-P2 and P2-P1.

The three straight line segments are defined by: R-VIA1, VIA1-VIA2, VIA2-S as shown in FIGS. 4-5.

Points VIA1 and VIA2 are chosen by the following "rules of thumb."

VIA1 is defined as the point of intersection of the extension of line R-P1 and the tangent to segment 2 at point P2.

VIA2 also lies on the straight line defined by P2 and VIA1. The distance P2-VIA2 is currently chosen to be 0.33*(length of straight line P2-S).

Length (straight line P2-VIA2)=0.33*Length (straight line P2-S).

An alternate way to choose VIA1 and VIA2 is to use a "search and optimization" approach to minimize the deviation of the approximated path from the desired path. Alternately, in a different example any suitable method may be utilized to define the via points such that interference with the substrate is avoided while maintaining continuous motion.

Figure 6A:
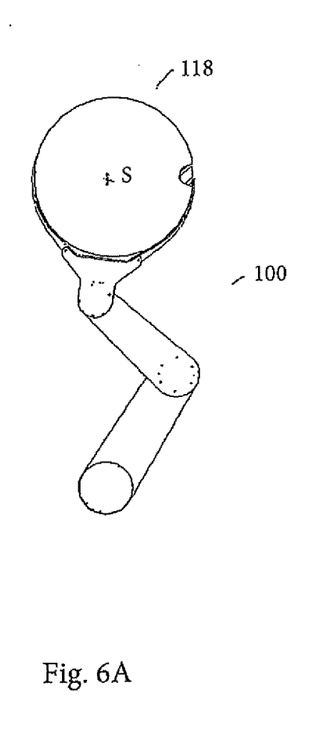
FIGS. 6A-6D are diagram illustrating different locations of the robot arm relative to the substrate.
Figure 6B:
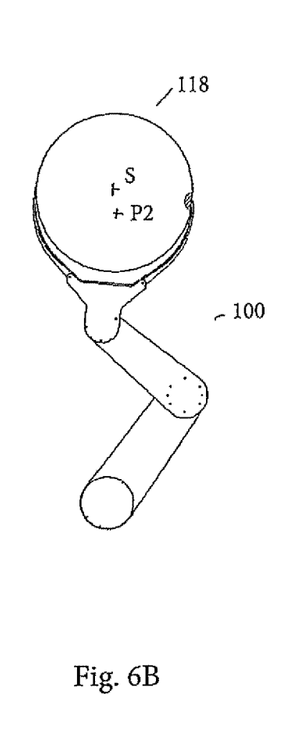
Figure 6C:
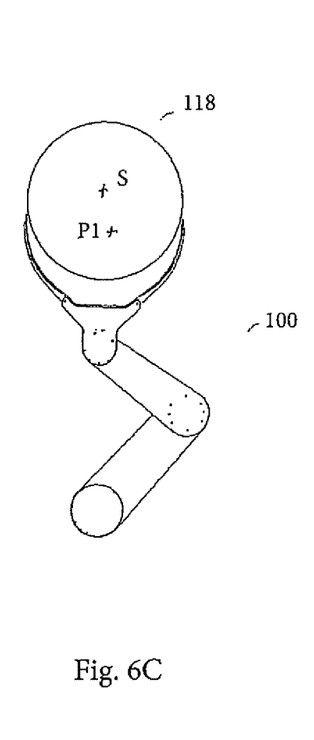
Figure 6D:
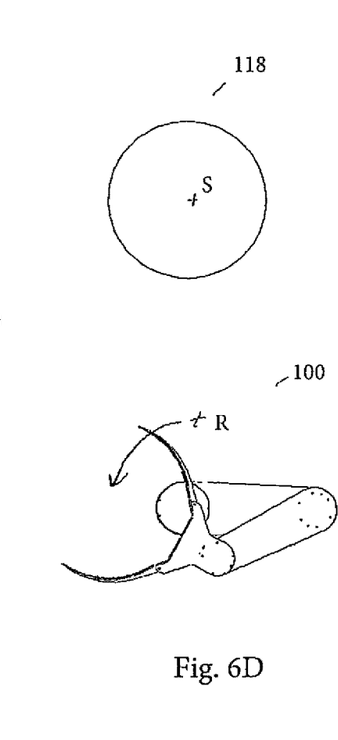
Figure 7A:
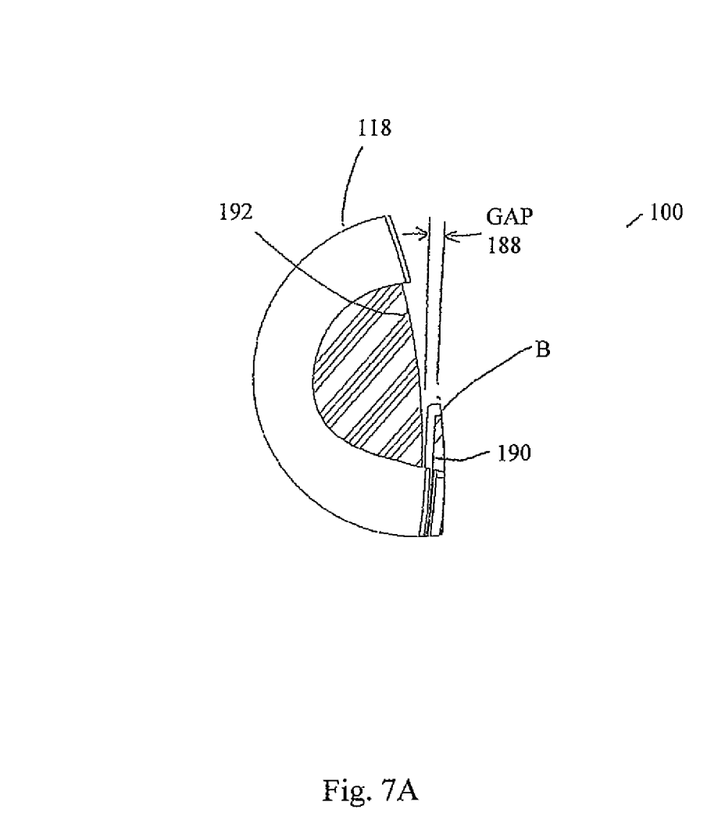
FIG. 7A is an enlarged partial view as in FIG. 6A with a cut-away section.
Figure 7B:
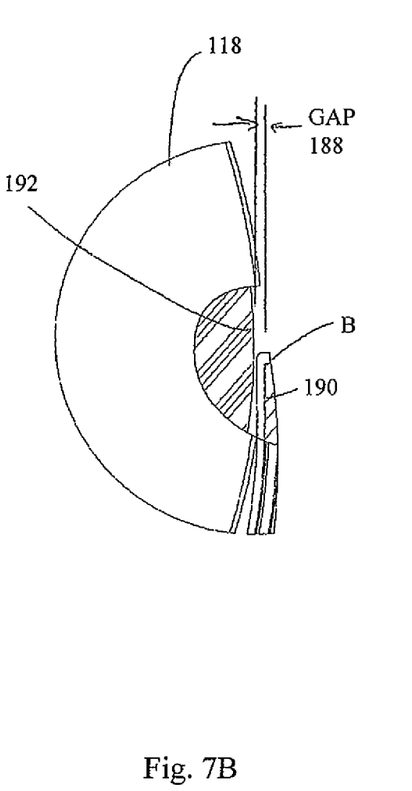
FIG. 7B is an enlarged partial view as in FIG. 6B with a cut-away section.

Referring to FIG. 6A, the robot 100 is shown in the extended place location at station center S. Referring also to FIG. 7A, tine B is shown in the position corresponding to FIG. 6A. Here, gap 188 is shown between a portion 190 of tine B and the edge 192 of substrate S. Portion 190 may be vertical, tapered or otherwise shaped. Referring to FIG. 63, the robot 100 is shown retracting from the extended place location at station center S through point P2. Referring also to FIG. 7B, tine B is shown in the position corresponding to FIG. 6B. Here, gap 188 is shown between a portion 190 of tine B and the edge 192 of substrate S. Here gap 188 between a tangent to edge 192 and tine B may be maintained as the arm retracts from the extended place location at station S through point P2. A similar gap at tine A may be maintained. The gap may remain constant as the arm retracts from the extended place location at station S through point P2. Alternately, the gap may be variable, for example, where the gap on the tine A side and the tine B side are maintained equal in the event of not parallel tines. Alternately, the gap on a single side may be maintained fixed or as a variable to drive the trajectory as the arm retracts from the extended place location at station S through point P2. Referring to FIG. 6C, there is shown robot 100 retracting from point P2 through point P1. Referring to FIG. 6D, there is shown robot 100 in a retracted position and rotated from point R.

Figure 9:
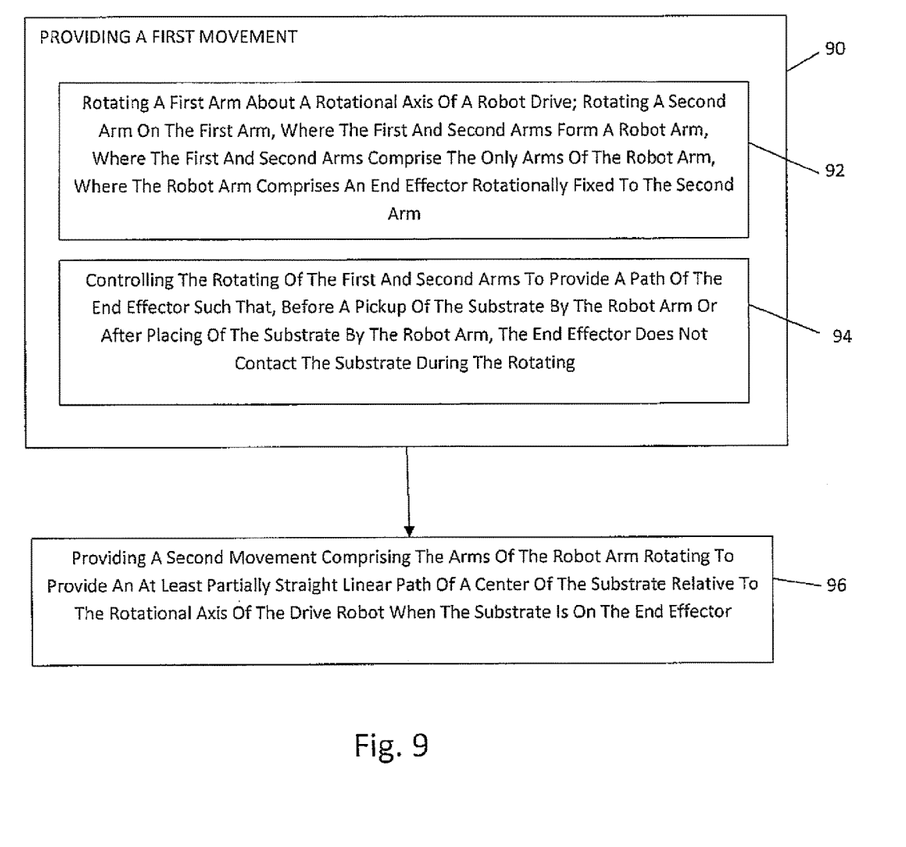
FIG. 9 is a diagram illustrating an example method.

Referring also to FIG. 9, an example method may comprise providing a first movement as indicated by block comprising: rotating a first arm about a rotational axis of a robot drive; rotating a second arm on the first arm as indicated by block 92, where the first and second arms form a robot arm, where the first and second arms comprise the only arms of the robot arm, where the robot arm comprises an end effector rotationally fixed to the second arm, and where the end effector is configured to support a substrate thereon for transporting the substrate by the robot arm; and controlling the rotating of the first and second arms as indicated by block 94 to provide a path of the end effector such that, before a pickup of the substrate by the robot arm or after placing of the substrate by the robot arm, the end effector does not contact the substrate during the rotating; and providing a second movement as indicated by block 96 comprising the arms of the robot arm rotating to provide an at least partially straight linear path of a center of the substrate relative to the rotational axis of the drive robot when the substrate is on the end effector.

The first and second movements may occur with the end effector in a single plane. The second movement may comprise an at least partially non-straight path. During the second movement, the end effector may comprise an inner ledge with a top surface to support a bottom surface of the substrate thereon, and a rim adjacent side edge of the substrate. The first movement may comprise the rim not contacting the side edge of the substrate. The path in the first movement may comprise a first arced path of the end effector and a second arced path of the end effector, where the first and second arced paths are in opposite directions. Controlling the rotating of the first and second arms may comprise a controller controlling rotation of drive shafts of the robot drive.

An example apparatus may comprise a robot drive; a robot arm comprising a first arm connected on a rotational axis of the robot drive, a second arm on the first arm, and an end effector rotationally fixed to the second arm, where the first and second arms comprise the only arms of the robot arm, and where the end effector is configured to support a substrate thereon for transporting the substrate by the robot arm;

a controller connected to the robot drive, where the controller comprises at least one processor and at least one non-transitory memory including computer program code, the at least one memory and the computer program code configured to, with the at least one processor, cause the apparatus to: control the rotating of the first and second arms to provide a first movement with a path of the end effector such that, before a pickup of the substrate by the robot arm or after placing of the substrate by the robot arm, the end effector does not contact the substrate during the rotating; and control the rotating of the first and second arms to provide a second movement with an at least partially straight linear path of a center of the substrate relative to the rotational axis of the drive robot when the substrate is on the end effector.

The controller may be configured to provide the first and second movements with the end effector in a single plane. The controller may be configured to provide the second movement with an at least partially non-straight path. The controller may be configured to provide, during the second movement, the end effector having an inner ledge with a top surface to support a bottom surface of the substrate thereon, and a rim adjacent a side edge of the substrate. The controller may be configured to provide the first movement with the rim not contacting the side edge of the substrate. The controller may be configured to provide the path in the first movement with a first arced path of the end effector and a second arced path of the end effector, where the first and second arced paths are in opposite directions. The controller may be configured to provide rotating of the first and second arms by controlling rotation of drive shafts of the robot drive.

An example may be provided in a non-transitory program storage device, such as memory 58 shown in FIG. 8 for example, readable by a machine, tangibly embodying a program of instructions executable by the machine for performing operations comprising: provide a first movement comprising: rotating a first arm about a rotational axis of a robot drive; rotating a second arm on the first arm, where the first and second arms form a robot arm, where the first and second arms comprise the only arms of the robot arm, where the robot arm comprises an end effector rotationally fixed to the second arm, and where the end effector is configured to support a substrate thereon for transporting the substrate by the robot arm; and controlling the rotating of the first and second arms to provide a path of the end effector such that, before a pickup of the substrate by the robot arm or after placing of the substrate by the robot arm, the end effector does not contact the substrate during the rotating; and provide a second movement comprising the arms of the robot arm rotating to provide an at least partially straight linear path of a center of the substrate relative to the rotational axis of the drive robot when the substrate is on the end effector.

The first and second movements may occur with the end effector along a single common plane. The second movement may comprise an at least partially non-straight path. During the second movement, the end effector may comprise an inner ledge with a top surface to support a bottom surface of the substrate thereon, and a rim adjacent a side edge of the substrate. The first movement may comprise the rim not contacting the side edge of the substrate. The path in the first movement may comprise a first arced path of the end effector and a second arced path of the end effector, where the first and second arced paths are in opposite directions.

Any combination of one or more computer readable medium(s) may be utilized as the memory. The computer readable medium may be a computer readable signal medium or a non-transitory computer readable storage medium. A non-transitory computer readable storage medium does not include propagating signals and may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A method comprising:
    providing a first movement comprising:
        rotating a first arm about a rotational axis of a robot drive;
        rotating a second arm about a rotational axis of a joint between the first arm and the second arm, where the first and second arms form a robot arm, where the first and second arms comprise the only arms of the robot arm, where the rotational axis of the robot drive and the rotational axis of the joint are the only rotational axes of the robot arm, where the robot arm comprises an end effector fixed to the second arm, wherein the end effector is fixed with respect to the second arm such that the end effector is rotationally stationary relative to the second arm, where the end effector is configured to support a substrate thereon for transporting the substrate by the robot arm, and where the robot arm is configured such that a center point of the substrate is spaced from a central axis of the second arm when the substrate is supported by the end effector; and
    controlling the rotating of the first and second arms to provide a path of the end effector such that, before a pickup of the substrate by the robot arm or after placing of the substrate by the robot arm, the end effector does not contact the substrate during the rotating; and
    providing a second movement comprising the arms of the robot arm rotating to provide an at least partially straight linear path of a center of the substrate relative to the rotational axis of the drive robot when the substrate is on the end effector.

2. A method as in claim 1 where the first and second movements occur with the end effector in a single plane.

3. A method as in claim 1 where the second movement comprises an at least partially non-straight path.

4. A method as in claim 1 where, during the second movement, the end effector comprises an inner ledge with a top surface to support a bottom surface of the substrate thereon, and a rim adjacent a side edge of the substrate.

5. A method as in claim 4 where the first movement comprises the rim not contacting the side edge of the substrate.

6. A method as in claim 1 where the path in the first movement comprises a first arced path of the end effector and a second arced path of the end effector, where the first and second arced paths are in opposite directions.

7. A method as in claim 1 where controlling the rotating of the first and second arms comprises a controller controlling rotation of drive shafts of the robot drive.

* * * * *